(12) United States Patent
Zhou et al.

(10) Patent No.: US 10,480,074 B2
(45) Date of Patent: *Nov. 19, 2019

(54) APPARATUS FOR RADICAL-BASED DEPOSITION OF DIELECTRIC FILMS

(71) Applicant: Applied Materials, Inc., Santa Clara, CA (US)

(72) Inventors: Jianhua Zhou, Campbell, CA (US); Juan Carlos Rocha-Alvarez, San Carlos, CA (US); Yihong Chen, San Jose, CA (US); Abhijit Basu Mallick, Fremont, CA (US); Oscar Lopez, San Jose, CA (US); Ningli Liu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 141 days.

This patent is subject to a terminal disclaimer.

(21) Appl. No.: 15/822,551

(22) Filed: Nov. 27, 2017

(65) Prior Publication Data

US 2018/0080125 A1 Mar. 22, 2018

Related U.S. Application Data

(63) Continuation of application No. 14/468,665, filed on Aug. 26, 2014, now Pat. No. 9,840,777.
(Continued)

(51) Int. Cl.
*C23C 16/50* (2006.01)
*C23C 16/455* (2006.01)
(Continued)

(52) U.S. Cl.
CPC .... *C23C 16/45565* (2013.01); *C23C 16/4584* (2013.01); *C23C 16/4586* (2013.01);
(Continued)

(58) Field of Classification Search
CPC ........ C23C 16/45565; C23C 16/45574; C23C 16/4586; C23C 16/5096; C23C 16/4584;
(Continued)

(56) References Cited

U.S. PATENT DOCUMENTS 6,099,747 A * 8/2000 Usami ................. C23C 16/402
118/625
2007/0256785 A1 * 11/2007 Pamarthy ............ H01J 37/3244
156/345.33

(Continued)

OTHER PUBLICATIONS

Wrobel, et al.; Remote Hydrogen Plasma Chemical Vapor Deposition Using an Organopentasilane Cluster as a Novel Film-Forming Precursor: Mechanism of the Activation Step; J. Appl. Phys. 76(1); 6 total pages; Jul. 1, 1994.

(Continued)

*Primary Examiner* — Rudy Zervigon
(74) *Attorney, Agent, or Firm* — Patterson + Sheridan LLP

(57) ABSTRACT

Embodiments disclosed herein generally include an apparatus for radical-based deposition of dielectric films. The apparatus includes a processing chamber, a radical source coupled to the processing chamber, a substrate support disposed in the processing chamber, and a dual-channel showerhead disposed between the radical source and the substrate support. The dual-channel showerhead includes a plurality of tubes and an internal volume surrounding the plurality of tubes. The plurality of tubes and the internal volume are surrounded by one or more annular channels embedded in the dual-channel showerhead. The dual-channel showerhead further includes a first inlet connected to the one or more channels and a second inlet connected to the internal volume. The processing chamber may be a PECVD chamber, and the apparatus is capable of performing a cyclic process (alternating radical based CVD and PECVD).

20 Claims, 2 Drawing Sheets

Related U.S. Application Data

(60) Provisional application No. 62/017,950, filed on Jun. 27, 2014.

(51) Int. Cl.
   *C23C 16/458* (2006.01)
   *C23C 16/509* (2006.01)
   *H01J 37/32* (2006.01)

(52) U.S. Cl.
   CPC .... *C23C 16/45574* (2013.01); *C23C 16/5096* (2013.01); *H01J 37/32357* (2013.01); *H01J 37/32422* (2013.01); *H01J 37/32449* (2013.01)

(58) Field of Classification Search
   CPC ........... H01J 37/32422; H01J 37/32357; H01J 37/32449
   USPC ......... 118/715; 156/345.33, 345.34
   See application file for complete search history.

(56) References Cited

U.S. PATENT DOCUMENTS

| | | |
|---|---|---|
| 2007/0256786 A1 | 11/2007 | Zhou et al. |
| 2009/0095222 A1 | 4/2009 | Tam et al. |
| 2009/0117746 A1* | 5/2009 | Masuda ............ C23C 16/45561 438/710 |
| 2009/0162261 A1 | 6/2009 | Baera et al. |
| 2010/0300359 A1* | 12/2010 | Armour ............ C23C 16/45565 118/724 |
| 2011/0011338 A1 | 1/2011 | Chuc |
| 2011/0052833 A1 | 3/2011 | Manawa et al. |
| 2011/0189860 A1 | 8/2011 | Porshnev |
| 2011/0256729 A1 | 10/2011 | Goodlin et al. |
| 2012/0064698 A1 | 3/2012 | Olgado |
| 2014/0027060 A1 | 1/2014 | Ranish et al. |
| 2014/0073144 A1 | 3/2014 | Chatterjee et al. |
| 2014/0099794 A1* | 4/2014 | Ingle .................. H01J 37/32357 438/710 |
| 2014/0113084 A1 | 4/2014 | Nguyen et al. |

OTHER PUBLICATIONS

Wrobel, et al.; Remote Hydrogen Plasma Chemical Vapor Deposition of Amorphous Hydrogenated Silicon-Carbon Films from an Organosilane Molecular Cluster as a Novel Single-Source Precursor: Structure, Growth Mechanism, and Properties of the Deposit; Chem. Mater. 1995, 7; pp. 1403-1413; Apr. 20, 1995.
Aoki, et al.; Silicon Nitride Film Growth by Remote Plasma CVD Using Tris(Dimethylamino)Silane; Vacuum/vol. 51/No. 4/pp. 747-750; 1998.
Wrobel, et al.; Reactivity of Alkylsilanes and Alkylcarbosilanes in Atomic Hydrogen-Induced Chemical Vapor Deposition; J. Electrochem. Soc., vol. 145, No. 3; pp. 1060-1065; Mar. 1998.
Wrobel, et al.; Chemical Vapor Deposition; Mechanism of the Initiation Step in Atomic Hydrogen-Induced CVD of Amorphous Hydrogenated Silicon-Carbon Films From Single-Source Precursors; 9 total pages; Apr. 8, 1998.
Wrobel, et al.; Mechanism of Amorphous Silica Film Formation From Tetraethoxysilane in Atomic Oxygen-Induced Chemical Vapor Deposition; J. Electrochem. Soc., vol. 145, No. 8; pp. 2866-2876; Aug. 1998.
Hatanaka, et al.; Experiments and Analysis of SiC Thin Film Deposition from Organo-Silicon by a Remote Plasma Method; pp. 287-291; 2000.
Wrobel, et al.; Chemical Vapor Deposition; Structure-Property Relationships of Amorphous Hydrogenated Silicon-Carbon Films Produced by Atomic Hydrogen-Induced CVD from a Single-Source Precursor; 8 total pages; Jul. 4, 2000.
Wrobel, et al.; Oligomerization and Polymerization Steps in Remote Plasma Chemical Vapor Deposition of Silicon-Carbon and Silica Films from Organosilicon Sources; Chem. Mater. 2001, 13; pp. 1884-1895; May 4, 2001.
Wrobel, et al.; Remote Hydrogen Plasma Chemical Vapor Deposition of Silicon-Carbon Thin-Film Materials from a Hexamethyldisilane Source: Characterization of the Process and Deposits; Journal of Applied Polymer Science, vol. 86; pp. 1445-1458; Feb. 7, 2002.
Wrobel, et al.; Remote Hydrogen-Nitrogen Plasma Chemical Vapor Deposition from a Tetramethyldisilazane Source. Part 1. Mechanism of the Process, Structure and Surface Morphology of Deposited Amorphous Hydrogenated Silicon Carbonitride Films; J. Mater. Chem., 2003, 13; pp. 731-737; Feb. 6, 2003.
Wrobel, et al.; Remote Hydrogen Plasma Chemical Vapor Deposition from (Dimethylsilyl)(Trimethylsilyl)Methane. 1. Kinetics of the Process; Chemical and Morphological Structure of Deposited Silicon-Carbon Films; Chem. Mater. 2003, 15; pp. 1749-1756; Mar. 27, 2003.
Wrobel, et al.; Remote Hydrogen Plasma Chemical Vapor Deposition from (Dimethylsilyl)(Trimethylsilyl)Methane. 2. Property-Structure Relationships for Resulting Silicon-Carbon Films; Chem. Mater. 2003, 15; pp. 1757-1762; Mar. 27, 2003.
Wrobel, et al.; Silicon Carbonitride Films by Remote Hydrogen-Nitrogen Plasma CVD from a Tetramethyldisilazane Source; Journal of the Electrochemical Society, 151 (11); pp. C723-C730; Oct. 22, 2004.
Blaszczyk-Lezak, et al.; Chemical Vapor Deposition; Silicon Carbonitride Films Produced by Remote Hydrogen Microwave Plasma CVD Using a (Dimethylamino)Dimethylsilane Precursor; Chem. Vap. Deposition 2005, 11, No. 1; pp. 44-52; Jun. 23, 2004.
Blaszczyk-Lezak, et al.; Remote Nitrogen Microwave Plasma Chemical Vapor Deposition from a Tetramethyldisilazane Precursor. 2. Properties of Deposited Silicon Carbonitride Films; pp. 35-41; Sep. 19, 2005.
Wrobel, et al.; Chemical Vapor Deposition; Remote Hydrogen Microwave Plasma CVD of Silicon Carbonitride Films from a Tetramethyldisilazane Source. Part 1: Characterization of the Process and Structure of the Films; Chem. Vap. Deposition 2007, 13; pp. 595-600; Apr. 13, 2007.
Wrobel, et al.; Chemical Vapor Deposition; Remote Hydrogen Microwave Plasma CVD of Silicon Carbonitride Films from a Tetramethyldisilazane Source. Part 2: Compositional and Structural Dependencies of Film Properties; Chem. Vap. Deposition 2007, 13; pp. 601-608; Apr. 13, 2007.
Wrobel, et al.; Chemical Vapor Deposition; Growth Mechanism and Chemical Structure of Amorphous Hydrogenated Silicon Carbide (a-SiC:H) Films Formed by Remote Hydrogen Microwave Plasma CVD From a Triethylsilane Precursor: Part 1; Chem. Vap. Deposition 2009, 15; pp. 39-46; Dec. 8, 2008.
Walkiewicz-Pietrzykowska, et al.; Chemical Vapor Deposition; Properties of Amorphous Hydrogenated Silicon Carbide (a-SiC:H) Films Formed by Remote Hydrogen Microwave Plasma CVD From a Triethylsilane Precursor: Part 2; Chem. Vap. Deposition 2009, 15; pp. 47-52; Dec. 8, 2008.
Wrobel, et al.; Applied Organometallic Chemistry; Reactivity of Organosilicon Precursors in Remote Hydrogen Microwave Plasma Chemical Vapor Deposition of Silicon Carbide and Silicon Carbonitride Thin-Film Coatings; Appl. Organometal. Chem. 2010, 24; pp. 201-207; Oct. 22, 2009.
Wrobel, et al.; Chemical Vapor Deposition; Silicon Carbonitride (SiCN) Films by Remote Hydrogen Microwave Plasma CVD from Tris(dimethylamino)silane as Novel Single-Source Precursor; Chem. Vap. Deposition 2010, 16; pp. 211-215; May 14, 2010.
Wrobel, et al.; Remote Hydrogen Microwave Plasma Chemical Vapor Deposition of Amorphous Silicon Carbonitride (a-SiCN) Coatings Derived From Tris(dimethylamino)Silane; Plasma Process. Polym. 2011, 8; pp. 542-556; Mar. 10, 2011.
Wrobel, et al.; Chemical Vapor Deposition; Amorphous Hydrogenated Silicon Carbide (a-SiC:H) Coatings Produced by Remote Hydrogen Microwave Plasma CVD from Bis(dimethylsilyl)ethane—a Novel Single-Source Precursor; Chem. Vap. Deposition 2011, 17; pp. 186-190; Jun. 8, 2011.
Wrobel, et al.; Hard a-SiC:H Films Formed by Remote Hydrogen Microwave Plasma Chemical Vapor Deposition Using a Novel Single-Source Precursor; pp. 7100-7108; 2012.

(56) References Cited

OTHER PUBLICATIONS

Wrobel, et al.; Chemical Vapor Deposition; a-SiC:H Films by Remote Hydrogen Microwave Plasma CVD From Ethylsilane Precursors; Chem. Vap. Deposition 2013, 19; pp. 242-250; Feb. 13, 2013.
PCT Notification of Transmittal of the International Search Report and the Written Opinion of the International Searching Authority for International Application No. PCT/US2015/031543 dated Aug. 27, 2015; 11 total pages.
Chinese Office Action (with attached English translation) for Application No. 201580034916.1; dated Nov. 16, 2018; 13 total pages.
Chinese Office Action (with attached English translation) for Application No. 201710941749.X; dated Mar. 20, 2019; 13 total pages.
Chinese Office Action (with attached English translation) for Application No. 201580034916.1; dated Jul. 31, 2019; 7 total pages.

* cited by examiner

APPARATUS FOR RADICAL-BASED DEPOSITION OF DIELECTRIC FILMS

CROSS-REFERENCE TO RELATED APPLICATIONS

This application is a continuation application of copending U.S. patent application Ser. No. 14/468,665 (Attorney Docket No. 021683US), filed on Aug. 26, 2014, which claims benefit of U.S. Provisional Patent Application Ser. No. 62/017,950 (021683USL), filed Jun. 27, 2014, which is herein incorporated by reference.

BACKGROUND

Field

Embodiments disclosed herein generally relate to an apparatus for forming dielectric films, and more specifically to an apparatus for forming dielectric films using radical-based deposition.

Description of the Related Art

The formation of hydrogen-free dielectric films, such as hydrogen-free silicon-containing dielectric films, is a critical task for developing the next generation of electronics devices. Plasma enhanced chemical vapor deposition (PECVD) deposition is commonly used to form dielectric films. However, current PECVD techniques for depositing amorphous silicon-containing dielectric films result in films containing a high hydrogen content, such as about 15 atomic percent or more of hydrogen. The high hydrogen content is largely in the form of silicon-hydrogen bonds, which produce defects in the dielectric films. Moreover, a high hydrogen content results in films with low etch selectivity, low thermal and mechanical performance and properties, and high shrinkage. In addition, plasma based process tends to damage the films due to charged particle bombardment and high energy UV irradiation. Therefore, there is a need for an apparatus for forming dielectric films, such as hydrogen-free dielectric films.

SUMMARY

Embodiments disclosed herein generally include an apparatus for radical-based deposition of dielectric films. The apparatus includes a processing chamber, a radical source coupled to the processing chamber, a substrate support disposed in the processing chamber, and a dual-channel showerhead disposed between the radical source and the substrate support. The dual-channel showerhead includes a plurality of tubes and an internal volume surrounding the plurality of tubes. The plurality of tubes and the internal volume are surrounded by one or more channels embedded in the dual-channel showerhead. The dual-channel showerhead further includes a first inlet connected to the one or more channels and a second inlet connected to the internal volume. The second inlet directs gases/radicals to the internal volume without passing through the one or more channels. The temperature of the dual-channel showerhead may be controlled. In addition, the processing chamber is capable of performing PECVD and the substrate support is rotatable and capable of heating a substrate disposed thereon. The processing chamber may be a PECVD chamber, and the apparatus is capable to perform cyclic process (alternating radical based chemical vapor deposition (CVD) and PECVD).

In one embodiment, an apparatus is disclosed. The apparatus includes a dual-channel showerhead. The dual-channel showerhead includes a first surface, a second surface opposite the first surface and spaced from the first surface to provide an internal volume. One or more annular channels in the dual-channel showerhead surround the internal volume. The dual-channel showerhead further includes a first inlet connected to the one or more annular channels, a second inlet bypassing the annular channels, wherein the second inlet is connected to the internal volume, and a plurality of tubes extending from the first surface to the second surface through the internal volume.

In one embodiment, an apparatus is disclosed. The apparatus includes a radical source and a processing chamber coupled to the radical source. The processing chamber includes a substrate support and a dual-channel showerhead. The dual-channel showerhead includes a first surface and a second surface opposite the first surface and spaced from the first surface to provide an internal volume. One or more annular channels in the dual-channel showerhead surround the internal volume. The dual-channel showerhead further includes a first inlet connected to the one or more annular channels, a second inlet bypassing the annular channels, wherein the second inlet is connected to the internal volume, and a plurality of tubes extending from the first surface to the second surface through the internal volume.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally include an apparatus for radical-based deposition of dielectric films. The apparatus includes a processing chamber, a radical source coupled to the processing chamber, a substrate support disposed in the processing chamber, and a dual-channel showerhead disposed between the radical source and the substrate support. The dual-channel showerhead includes a plurality of tubes and an internal volume surrounding the plurality of tubes. The plurality of tubes and the internal volume are surrounded by one or more channels embedded in the dual-channel showerhead. The dual-channel showerhead further includes a first inlet connected to the one or more channels and a second inlet connected to the internal volume. The second inlet is configured to direct gases/radicals to the internal volume without passing through the one or more channels.

Figure 1:
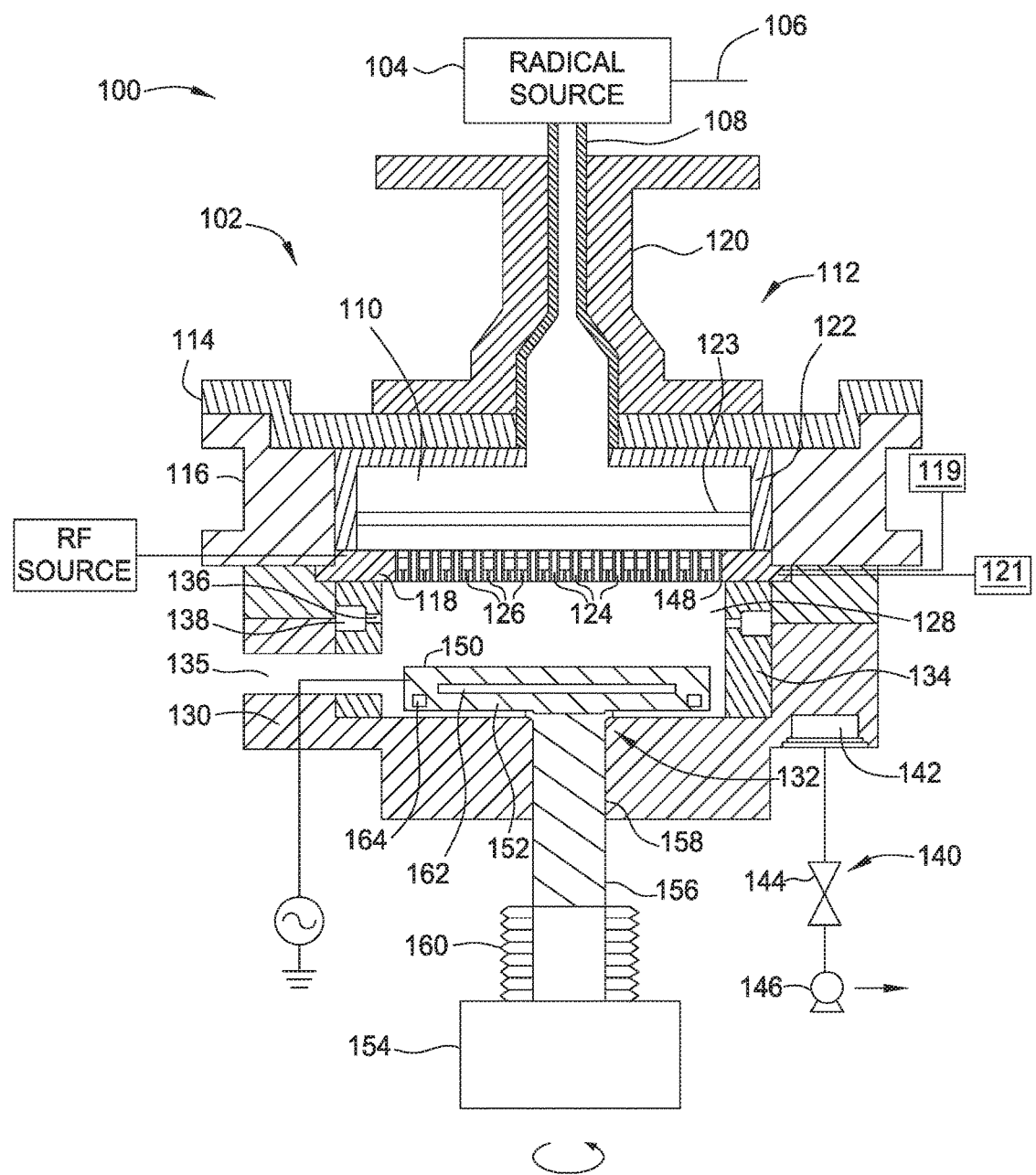
FIG. 1 is a cross sectional view of an apparatus for radical-based deposition of dielectric films according to one embodiment described herein.

FIG. 1 is a cross sectional view of an apparatus 100 for radical-based deposition of dielectric films according to one embodiment described herein. In one embodiment, the apparatus 100 includes a processing chamber 102 and a radical source 104 coupled to the processing chamber 102. The radical source 104 may be any suitable source that is capable of generating radicals. Radical based CVD has the advantages of well controlled growth conditions, low thermal budget, free of defect and high quality films. The radical source 104 may be a remote plasma source, such as a radio frequency (RF) or very high radio frequency (VHRF) capacitively coupled plasma (CCP) source, an inductively coupled plasma (ICP) source, a microwave induced (MW) plasma source, a DC glow discharge source, an electron cyclotron resonance (ECR) chamber, or a high density plasma (HDP) chamber. Alternatively, the radical source 104 may be an ultraviolet (UV) source or the filament of a hot wire chemical vapor deposition (HW-CVD) chamber. The radical source 104 may include one or more gas inlets 106 and the radical source 104 may be coupled to the processing chamber 102 by a radical conduit 108. One or more process gases, which may be radical-forming gases, may enter the radical source 104 via the one or more gas inlets 106. The one or more process gases may comprise a hydrogen containing gas, such as hydrogen, $H_2O$, or ammonia. Radicals generated in the radical source 104, such as hydrogen radicals, travel into the processing chamber 102 through the radical conduit 108.

The radical conduit 108 is a part of a lid assembly 112, which also includes a radical cavity 110, a top plate 114, a lid rim 116, and a dual-channel showerhead 118. The radical conduit 108 may comprise a material that is substantially unreactive to radicals. For example, radical conduit 108 may comprise AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics. A representative example of a suitable $SiO_2$ material is quartz. Alternatively or additionally, radical conduit 108 may have a coating on the surface that contacts the radicals in operation. The coating may also comprise AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics. If a coating is used, the thickness of the coating may be between about 1 µm and about 1 mm. The coating may be applied using a spray coating process. The radical conduit 108 may be disposed within and supported by a radical conduit support member 120. The radical conduit support member 120 may be disposed on the top plate 114, which rests on the lid rim 116.

The radical cavity 110 is positioned below and coupled to the radical conduit 108, and the radicals generated in the radical source 104 travel to the radical cavity 110 through the radical conduit 108. Radical cavity 110 is defined by the top plate 114, the lid rim 116 and the dual-channel showerhead 118. Optionally, the radical cavity 110 may include a liner 122. The liner 122 may cover surfaces of the top plate 114 and the lid rim 116 that are within the radical cavity 110. The liner 122 may comprise a material that is substantially unreactive to radicals. For example, the liner 122 may comprise AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics. Alternatively or in addition to, the surfaces of the radical cavity 110 that are in contact with radicals may be composed of or coated with a material that is substantially unreactive to radicals. For example, the surfaces may be composed of or coated with AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics. If a coating is used, the thickness of the coating may be between about 1 µm and about 1 mm. By not consuming the generated radicals, the radical flux to a substrate disposed in the processing chamber 102 is increased.

A radical distribution plate 123 may be disposed in the radical cavity 110 between the top plate 114 and the dual-channel showerhead 118. The radical distribution plate 123 may be made of the same material as the liner 122. The radical distribution plate 123 may be used to control the radical flow profile. The location of the radical distribution plate 123 in the radical cavity 110, i.e., the distance between the radical distribution plate 123 and the top plate 114, and the distance between the radical distribution plate 123 and the dual-zone showerhead 118, may be critical in terms of radical distribution. Radicals then pass through a plurality of tubes 124 disposed in the dual-channel showerhead 118 to enter into a processing region 128. The dual-channel showerhead 118 further includes a plurality of openings 126 that are smaller in diameter than the plurality of tubes 124. The plurality of openings 126 are connected to an internal volume (not shown) that is not in fluid communication with the plurality of tubes 124. At least two gas/radical sources 119, 121 may be coupled to the dual-channel showerhead 118. The dual-channel showerhead 118 may be heated or cooled. In one embodiment, the dual-channel showerhead 118 is heated to a temperature of about 100 degrees C. to about 250 degrees C. In another embodiment, the dual-channel showerhead 118 is cooled to a temperature of about 25 degrees C. to about 75 degrees C. The dual-channel showerhead 118 is described in detail in FIG. 2.

The processing chamber 102 may include the lid assembly 112, a chamber body 130 and a support assembly 132. The support assembly 132 may be at least partially disposed within the chamber body 130. The chamber body 130 may include a slit valve opening 135 to provide access to the interior of the processing chamber 102. The chamber body 130 may include a liner 134 that covers the interior surfaces of the chamber body 130. The liner 134 may include one or more apertures 136 and a pumping channel 138 formed therein that is in fluid communication with a vacuum system 140. The apertures 136 provide a flow path for gases into the pumping channel 138, which provides an egress for the gases within the processing chamber 102. Alternatively, the apertures and the pumping channel may be disposed in the bottom of the chamber body 130, and the gases may be pumped out of the processing chamber 102 from the bottom of the chamber body 130.

The vacuum system 140 may include a vacuum port 142, a valve 144 and a vacuum pump 146. The vacuum pump 146 is in fluid communication with the pumping channel 138 via the vacuum port 142. The apertures 136 allow the pumping channel 138 to be in fluid communication with the processing region 128 within the chamber body 130. The processing region 128 is defined by a lower surface 148 of the dual-channel showerhead 118 and an upper surface 150 of the support assembly 132, and the processing region 128 is surrounded by the liner 134.

The support assembly 132 may include a support member 152 to support a substrate (not shown) for processing within the chamber body 130. The substrate may be any standard wafer size, such as, for example, 300 mm. Alternatively, the substrate may be larger than 300 mm, such as 450 mm or larger. The support member 152 may comprise AlN or aluminum depending on operating temperature. The support member 152 may be configured to chuck the substrate and the support member 152 may be an electrostatic chuck or a vacuum chuck.

The support member 152 may be coupled to a lift mechanism 154 through a shaft 156 which extends through a centrally-located opening 158 formed in a bottom surface of the chamber body 130. The lift mechanism 154 may be flexibly sealed to the chamber body 130 by bellows 160 that prevents vacuum leakage from around the shaft 156. The lift mechanism 154 allows the support member 152 to be moved vertically within the chamber body 130 between a process position and a lower, transfer position. The transfer position is slightly below the opening of the slit valve 135. During operation, the spacing between the substrate and the dual-channel showerhead 118 may be minimized in order to maximize radical flux at the substrate surface. For example, the spacing may be between about 100 mm and about 5,000 mm. The lift mechanism 154 may be capable of rotating the shaft 156, which in turn rotates the support member 152, causing the substrate disposed on the support member 152 to be rotated during operation. Rotation of the substrate helps improving deposition uniformity.

One or more heating elements 162 and a cooling channel 164 may be embedded in the support member 152. The heating elements 162 and cooling channel 164 may be used to control the temperature of the substrate during operation. The heating elements 162 may be any suitable heating elements, such as one or more resistive heating elements. The heating elements 162 may be connected to one or more power sources (not shown). The heating elements 162 may be controlled individually to have independent heating and/or cooling control on multi-zone heating or cooling. With the ability to have independent control on multi-zone heating and cooling, the substrate temperature profile can be enhanced at any giving process conditions. A coolant may flow through the channel 164 to cool the substrate. The support member 152 may further include gas passages extending to the upper surface 150 for flowing a cooling gas to the backside of the substrate.

An RF source may be coupled to either the dual-channel showerhead 118 or the support member 152. The RF source may be low frequency, high frequency, or very high frequency. In one embodiment, the dual-channel showerhead 118 is coupled to the RF source and the support member 152 is grounded, as shown in FIG. 1. In another embodiment, the dual-channel showerhead 118 is grounded and the support member 152 is coupled to the RF source. In either embodiment, a capacitively coupled plasma may be formed in the processing region 128 between the dual-channel showerhead 118 and the support member 152 during operation. The capacitively coupled plasma formed in the processing region 128 is in addition to the plasma formed in the radical source when the radical source is a remote plasma source. The support member 152 may be biased with a DC source to increase ion bombardment. Thus, the processing chamber 102 may be a PECVD chamber, and the apparatus 100 is capable to perform a cyclic process (alternating radical based CVD and PECVD).

Figure 2A:
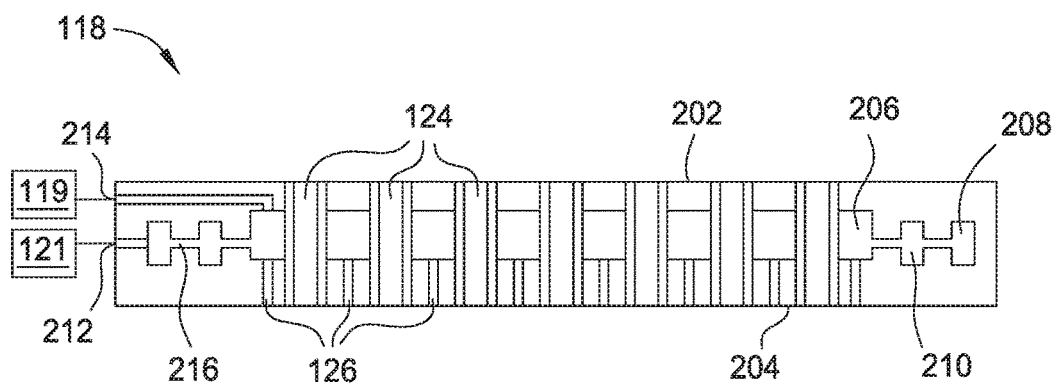
FIGS. 2A-2C illustrate a dual-channel showerhead according to embodiments described herein.

FIG. 2A is a cross sectional view of the dual-channel showerhead 118 according to embodiments described herein. The dual-channel showerhead 118 may have a first surface 202 that is facing the radical cavity 110 and a second surface 204 opposite the first surface 202. The second surface 204 may be facing the support assembly 132. The first surface 202 may be spaced from the second surface 204 to provide an internal volume 206. The first and second surfaces 202, 204 may be composed of or coated with a material that is substantially unreactive to radicals. For example, the surfaces 202, 204 may be composed of or coated with AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics. If a coating is used, the thickness of the coating may be between about 1 μm and about 1 mm. A plurality of tubes 124 may be formed in the dual-channel showerhead 118. The tubes 124 may extend from the first surface 202 to the second surface 204, and radicals generated from the radical source 104 may pass through the tubes 124 to reach the substrate disposed on the support assembly 132. The internal volume 206 may surround the plurality of tubes 124 and one or more annular channels 208, 210 may surround the internal volume 206 and the plurality of tubes 124.

The internal volume 206 may be in fluid communication with the one or more annular channels 208, 210. The plurality of openings 126 may extend from the internal volume 206 to the second surface 204. The one or more annular channels 208, 210 may be connected to an inlet 212, which is coupled to the gas source 121. The gas source 121 may provide a precursor gas, such as a silicon containing gas, to the dual-channel showerhead 118, and the precursor gas flows through the one or more annular channels 208, 210 to the internal volume 206, and to the processing region 128 via the plurality of openings 126. Examples of the silicon containing precursor gas include organosilicon, tetraalkyl orthosilicate gases, and disiloxane. Organosilicon gases include gases of organic compounds having at least one carbon-silicon bond. Tetraalkyl orthosilicate gases include gases consisting of four alkyl groups attached to an $SiO_4^{4-}$ ion. More particularly, the one or more precursor gases may be (dimethylsilyl)(trimethylsilyl)methane $((Me)_3SiCH_2SiH(Me)_2)$, hexamethyldisilane $((Me)_3SiSi(Me)_3)$, trimethylsilane $((Me)_3SiH)$, tetramethylsilane $((Me)_4Si)$, tetraethoxysilane $((EtO)_4Si)$, tetramethoxysilane $((MeO)_4Si)$, tetrakis-(trimethylsilyl)silane $((Me_3Si)_4Si)$, (dimethylamino) dimethylsilane $((Me_2N)SiHMe_2)$ dimethyldiethoxysilane $((EtO)_2Si(Me)_2)$, dimethyldimethoxysilane $((MeO)_2Si(Me)_2)$, methyltrimethoxysilane $((MeO)_3Si(Me))$, dimethoxytetramethyl-disiloxane $(((Me)_2Si(OMe))_2O)$, tris(dimethylamino)silane $((Me_2N)_3SiH)$, bis(dimethylamino)methylsilane $((Me_2N)_2CH_3SiH)$, disiloxane $((SiH_3)_2O)$, and combinations thereof.

Since the openings in the plurality of tubes 124 are not in fluid communication with the internal volume 206, the radicals passing through the plurality of tubes 124 are not mixed with the precursor gas in the dual-channel showerhead 118. Because the showerhead 118 contains two channels that are not in fluid communication of each other, the showerhead 118 is a dual-channel showerhead 118. The plurality of tubes 124 each has an inside diameter of about 0.10 in to about 0.35 in. The plurality of openings 126 each has a diameter of about 0.01 in to about 0.04 in.

The one or more annular channels 208, 210 may be connected by one or more connecting channels 216 that have a much smaller cross section than the annular channels 208, 210. This configuration helps the precursor gas to be distributed evenly into the internal volume 206 and out of the openings 126. However, if radicals are to enter the inlet 212, the radicals may recombine when flowing from the large annular channel 208 to the smaller connecting channels 216. In order to provide a path for radicals that are distinct from the radicals formed in the radical source 104, a second inlet 214 is formed in the dual-channel showerhead 118, and the second inlet 214 is connected to the internal volume 206, bypassing the one or more annular channels 208, 210. The second inlet 214 may be distinct from the first inlet 212, and may be configured to direct radicals from the radical source 119 to the internal volume 206 without passing through the one or more annular channels 208, 210. In one embodiment, fluorine radicals are generated in the radical source 119 and are introduced into the internal volume 206 via the second inlet 214. The fluorine radicals are then directed to the processing region 128 through the plurality of openings 126. The fluorine radicals may be used to clean the interior surfaces of the processing chamber 102. The fluorine radicals may not be delivered from the radical source 104 in order to improve the lifetime of the radical source 104.

Figure 2B:
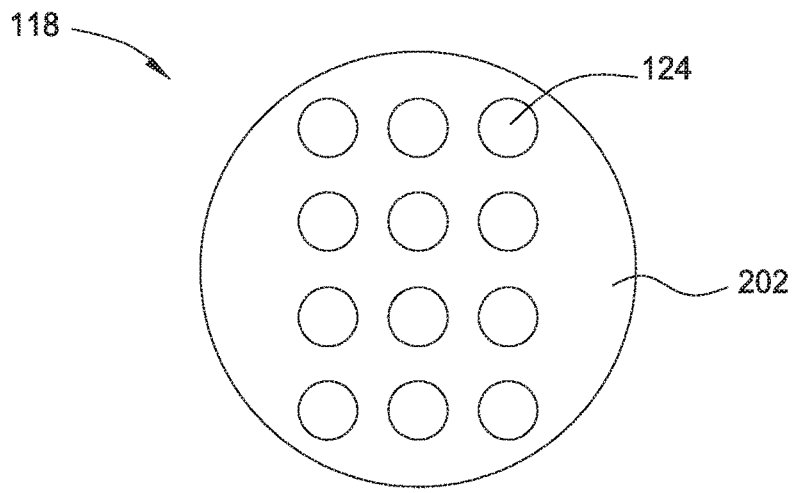

FIG. 2B is a top view of the dual-channel showerhead 118 according to embodiments described herein. The dual-channel showerhead 118 includes the first surface 202 and the plurality of tubes 124 extending from the first surface 202 to the second surface 204. The one or more annular channels 208, 210 and the internal volume 206 are all embedded in the dual-channel showerhead 118, thus are not shown in the top view of the dual-channel showerhead 118.

Figure 2C:
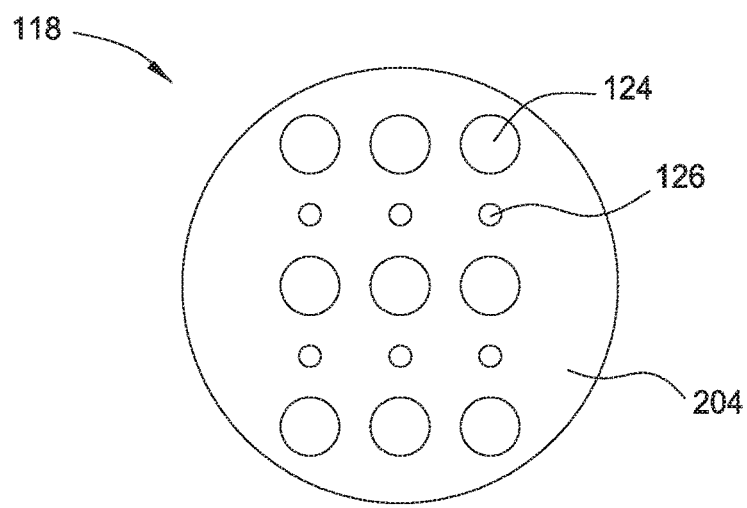

FIG. 2C is a bottom view of the dual-channel showerhead 118 according to embodiments described herein. The dual-channel showerhead 118 includes the second surface 204, the plurality of tubes 124 extending from the first surface 202 to the second surface 204, and the plurality of openings 126. The one or more annular channels 208, 210 and the internal volume 206 are all embedded in the dual-channel showerhead 118, thus are not shown in the bottom view of the dual-channel showerhead 118. The arrangement of the plurality of tubes 124 and the plurality of openings 126 may enhance the uniformity of gas/radical distribution across the substrate and may vary based on the process conditions.

In summary, an apparatus for forming dielectric films using radical based deposition is disclosed. The apparatus may include a processing chamber coupled to a radical source. The processing chamber may include a dual-channel showerhead that has a plurality of tubes, an internal volume surrounding the tubes, and one or more channels surrounding the tubes and the internal volume. The dual-channel showerhead may include a first inlet connected to the one or more channels and a second inlet connected to the internal volume. The second inlet is configured to direct radicals to the internal volume without passing though the one or more channels. In this configuration, radicals entered from the second inlet are not recombined in the one or more channels.

While the foregoing is directed to embodiments, other and further embodiments may be devised without departing from the basic scope thereof, and the scope thereof is determined by the claims that follow.

What is claimed is:

1. A dual-channel showerhead, comprising:
   a first surface;
   a second surface opposite the first surface and spaced from the first surface, wherein an internal volume and one or more channels are defined between the first surface and the second surface, and wherein the one or more channels surround the internal volume;
   a plurality of tubes extending from the first surface to the second surface through the internal volume, wherein the plurality of tubes is fluidly isolated from the internal volume;
   a first inlet connected to the one or more channels; and
   a second inlet positioned to direct radicals to the internal volume bypassing the one or more channels, wherein the first inlet is positioned to provide a gas to a location upstream of the one or more channels, and the second inlet is positioned to provide radicals to a location downstream of the one or more channels.

2. The dual-channel showerhead of claim 1, wherein the first surface and the second surface are coated with AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics.

3. The dual-channel showerhead of claim 1, wherein the one or more channels are two channels, and the two channels are connected by one or more connecting channels.

4. The dual-channel showerhead of claim 3, wherein the cross sectional area of each of the one or more connecting channels is smaller than the cross sectional area of each of the two channels.

5. The dual-channel showerhead of claim 1, wherein each tube of the plurality of tubes has an inside diameter of about 0.10 in to about 0.35 in.

6. The dual-channel showerhead of claim 5, further comprising a plurality of openings extending from the internal volume to the second surface.

7. The dual-channel showerhead of claim 6, wherein each opening of the plurality of openings has a diameter of about 0.01 in to about 0.04 in.

8. A dual-channel showerhead, comprising:
   a first surface;
   a second surface opposite the first surface and spaced from the first surface, wherein an internal volume and one or more annular channels in fluid communication with the internal volume are defined between the first surface and the second surface, and wherein the one or more annular channels surround the internal volume;
   a plurality of tubes extending from the first surface to the second surface through the internal volume, wherein the plurality of tubes is fluidly isolated from the internal volume;
   a first inlet connected to the one or more annular channels; and
   a second inlet positioned to direct radicals to the internal volume bypassing the one or more annular channels, wherein the first inlet and the second inlet are located on the same surface that is distinct from the first surface and the second surface.

9. The dual-channel showerhead of claim 8, wherein the first surface and the second surface are coated with AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics.

10. The dual-channel showerhead of claim 8, wherein the one or more annular channels are two annular channels, and the two annular channels are connected by one or more connecting channels.

11. The dual-channel showerhead of claim 10, wherein the cross sectional area of each of the one or more connecting channels is smaller than the cross sectional area of each of the two annular channels.

12. The dual-channel showerhead of claim 8, wherein the plurality of tubes each has an inside diameter of about 0.10 in to about 0.35 in.

13. The dual-channel showerhead of claim 12, further comprising a plurality of openings extending from the internal volume to the second surface.

14. The dual-channel showerhead of claim 13, wherein the plurality of openings each has a diameter of about 0.01 in to about 0.04 in.

15. An apparatus, comprising:
a radical source; and
a processing chamber coupled to the radical source, wherein the processing chamber comprises:
  a substrate support; and
  a dual-channel showerhead disposed between the radical source and the substrate support, wherein the dual-channel showerhead comprises:
    a first surface facing the radical source;
    a second surface facing the substrate support and spaced from the first surface, wherein an internal volume and one or more channels are defined between the first surface and the second surface, and wherein the one or more channels surround the internal volume;
    a plurality of tubes extending from the first surface to the second surface through the internal volume, wherein the plurality of tubes is fluidly isolated from the internal volume;
    a first inlet connected to the one or more channels; and
    a second inlet positioned to direct radicals to the internal volume bypassing the one or more channels, wherein the first inlet is positioned to provide a gas to a location upstream of the one or more channels, and the second inlet is positioned to provide radicals to a location downstream of the one or more channels.

16. The apparatus of claim 15, wherein the dual-channel showerhead is grounded and the substrate support is connected to an RF source.

17. The apparatus of claim 15, wherein the substrate support comprises one or more heating elements and a cooling channel.

18. The apparatus of claim 15, wherein the substrate support is connected to a DC source.

19. The apparatus of claim 15, wherein the substrate support is rotatable.

20. The apparatus of claim 15, wherein the processing chamber is a PECVD chamber.

* * * * *